United States Patent
Oeschler et al.

(10) Patent No.: US 8,736,052 B2
(45) Date of Patent: May 27, 2014

(54) SEMICONDUCTOR DEVICE INCLUDING DIFFUSION SOLDERED LAYER ON SINTERED SILVER LAYER

(75) Inventors: Niels Oeschler, Moehnesee (DE); Kirill Trunov, Duisburg (DE); Roland Speckels, Kamen (DE)

(73) Assignee: Infineon Technologies AG, Neubiberg (DE)

( * ) Notice: Subject to any disclaimer, the term of this patent is extended or adjusted under 35 U.S.C. 154(b) by 259 days.

(21) Appl. No.: 13/214,379

(22) Filed: Aug. 22, 2011

(65) Prior Publication Data

US 2013/0049204 A1 Feb. 28, 2013

(51) Int. Cl.
*H01L 29/40* (2006.01)

(52) U.S. Cl.
USPC .............. 257/738; 257/737; 257/784

(58) Field of Classification Search
USPC .......................... 257/737, 738, 784
See application file for complete search history.

(56) References Cited

U.S. PATENT DOCUMENTS

| | | | |
|---|---|---|---|
| 4,851,301 A | 7/1989 | Greenstein | |
| 6,326,088 B1 | 12/2001 | Mayer et al. | |
| 6,872,464 B2 | 3/2005 | Huebner et al. | |
| 7,368,824 B2 | 5/2008 | Hosseini et al. | |
| 7,508,012 B2 | 3/2009 | Otremba | |
| 7,851,910 B2 | 12/2010 | Riedl | |
| 7,888,782 B2 | 2/2011 | Nelle et al. | |
| 2004/0245648 A1* | 12/2004 | Nagasawa et al. | 257/772 |
| 2007/0025684 A1 | 2/2007 | Otremba | |
| 2007/0205253 A1 | 9/2007 | Hubner | |
| 2008/0006923 A1 | 1/2008 | Otremba | |
| 2010/0155938 A1* | 6/2010 | Martinez et al. | 257/737 |
| 2011/0070695 A1 | 3/2011 | Bayerer | |
| 2011/0089545 A1 | 4/2011 | Nelle et al. | |
| 2012/0273935 A1* | 11/2012 | Martens et al. | 257/737 |

OTHER PUBLICATIONS

"Low Temperature Sinter Technology Die Attachment for Power Electronic Applications", C. Goebl, et al., CIPS Mar. 16-18, 2010 (5 pgs.).

"New Assembly and Interconnects Beyond Sintering Methods", Karsten Guth, et al., ISBN, PCIM May 4-8, 2010 (6 pgs.).

"Reliability Assessment of Sintered Nano-Silver Die Attachment for Power Semiconductors", Matthias Knoerr, et al., IEEE, 2010 (6 pgs.).

* cited by examiner

*Primary Examiner* — James Mitchell

(74) *Attorney, Agent, or Firm* — Dicke, Billig & Czaja, PLLC

(57) ABSTRACT

A semiconductor device includes a substrate and a first sintered silver layer on the substrate. The semiconductor device includes a first semiconductor chip and a first diffusion soldered layer coupling the first semiconductor chip to the first sintered silver layer.

22 Claims, 4 Drawing Sheets

SEMICONDUCTOR DEVICE INCLUDING DIFFUSION SOLDERED LAYER ON SINTERED SILVER LAYER

BACKGROUND

Power electronic modules are semiconductor packages that are used in power electronic circuits. Power electronic modules are typically used in vehicular and industrial applications, such as in inverters and rectifiers. The semiconductor components included within the power electronic modules are typically insulated gate bipolar transistor (IGBT) semiconductor chips or metal-oxide-semiconductor field effect transistor (MOSFET) semiconductor chips. The IGBT and MOSFET semiconductor chips have varying voltage and current ratings. The semiconductor components included within the power electronic modules may also include diodes, thyristors, junction gate field-effect transistors (JFETs), and bipolar transistors. Both passive components and control electronics may be included within the power electronic modules. The semiconductor components are made from Si, SiC, GaN, GaAs, or other suitable substrates. Some power electronic modules include additional semiconductor diodes (i.e., free-wheeling diodes) in the semiconductor package for overvoltage protection.

In general, two different power electronic module designs are used. One design is for higher power applications and the other design is for lower power applications. For higher power applications, a power electronic module typically includes several semiconductor chips integrated on a single substrate. The substrate typically includes an insulating ceramic substrate, such as $Al_2O_3$, AlN, $Si_3N_4$, or other suitable material, to insulate the power electronic module. At least the top side of the ceramic substrate is metallized with either pure or plated Cu, Al, or other suitable material to provide electrical and mechanical contacts for the semiconductor chips. The metal layer is typically bonded to the ceramic substrate using a direct copper bonding (DCB) process, a direct aluminum bonding process (DAB) process, or an active metal brazing (AMB) process.

Typically, soft soldering with Sn—Pb, Sn—Ag, Sn—Ag—Cu, or another suitable solder alloy is used for joining a semiconductor chip to a metallized ceramic substrate. Typically, several substrates are combined onto a metal baseplate. In this case, the backside of the ceramic substrate is also metallized with either pure or plated Cu, Al, or other suitable material for joining the substrates to the metal baseplate. To join the substrates to the metal baseplate, soft soldering with Sn—Pb, Sn—Ag, Sn—Ag—Cu, or another suitable solder alloy is typically used.

For high temperature applications, the low melting point of the solder joints ($T_m$=180° C.-220° C.) becomes a critical parameter for power electronic modules. During operation of power electronic modules, the areas underneath the semiconductor chips are exposed to high temperatures. In these areas, the ambient air temperature is superposed by the heat that is dissipated inside the semiconductor chip. This leads to a thermal cycling during operation of the power electronic modules. Typically, with respect to thermal cycling reliability, a reliable function of a solder joint cannot be guaranteed above 150° C. Above 150° C., cracks may form inside the solder region after a few thermal cycles. The cracks can easily spread over the entire solder region and lead to the failure of the power electronic module.

With the increasing desire to use power electronics in harsh environments (e.g., automotive applications) and the ongoing integration of semiconductor chips, the externally and internally dissipated heat continues to increase. Therefore, there is a growing demand for high temperature power electronic modules capable of operating with internal and external temperatures up to and exceeding 200° C.

For these and other reasons, there is a need for the present invention.

SUMMARY

One embodiment provides a semiconductor device. The semiconductor device includes a substrate and a first sintered silver layer on the substrate. The semiconductor device includes a first semiconductor chip and a first diffusion soldered layer coupling the first semiconductor chip to the first sintered silver layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As used herein, the term "electrically coupled" is not meant to mean that the elements must be directly coupled together and intervening elements may be provided between the "electrically coupled" elements.

Figure 1:
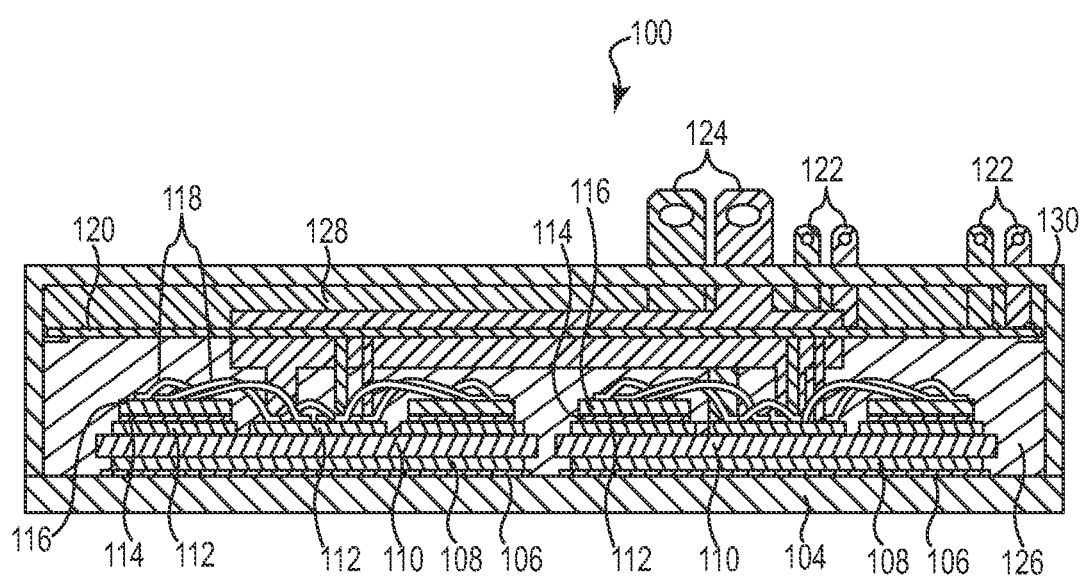
FIG. 1 illustrates a cross-sectional view of one embodiment of a semiconductor device.

FIG. 1 illustrates a cross-sectional view of one embodiment of a semiconductor device 100. In one embodiment, semiconductor device 100 is a high temperature (i.e., up to and exceeding 200° C.) high power electronic module. Power electronic module 100 includes a metal baseplate 104, joints 106 including a sintered silver layer and a diffusion soldered layer, metalized ceramic substrates 110 including metal surfaces or layers 108 and 112, joints 114 each including a sintered silver layer and a diffusion soldered layer, semiconductor chips 116, bond wires 118, circuit board 120, control contacts 122, power contacts 124, potting 126 and 128, and a housing 130. In other embodiments, metal baseplate 104 is replaced with a substrate, and circuit board 120 is excluded and control contacts 122 are copper leads, pins, or other suitable contacts.

Joints including a sintered silver layer and a diffusion soldered layer provide a high melting point bond between each semiconductor chip 116 and metalized ceramic substrate 110, and between metalized ceramic substrate 110 and metal baseplate 104. By using a sintered silver layer, Ag—Sn intermetallic phases are formed in the diffusion soldered layer. Ag—Sn intermetallic phases have a higher melting point than Cu—Sn intermetallic phases. For example, $Ag_3Sn$ has a melting point of 480° C. while $Cu_6Sn_5$ has a melting point of 415° C. In addition, the Young's modulus of Ag—Sn intermetallic phases is enhanced compared to Cu—Sn intermetallic phases. Further, Ag—Sn intermetallic phases are more ductile than Cu—Sn intermetallic phases. Therefore, by using joints including a sintered silver layer and a diffusion soldered layer, the reliability of the semiconductor device is improved.

Ceramic substrates 110 include $Al_2O_3$, AlN, $Si_3N_4$, or other suitable material. In one embodiment, ceramic substrates 110 each have a thickness within a range of 0.2 mm to 2.0 mm. Metal layers 108 and 112 include Cu, Al, or another suitable material. In one embodiment, metal layers 108 and/or 112 are plated with Ni, Ag, Au, and/or Pd. In one embodiment, metal layers 108 and 112 each have a thickness within a range of 0.1 mm to 0.6 mm. In one embodiment, metal layers 108 and 112 are bonded to ceramic substrate 110 using a direct copper bonding (DCB) process to provide a DCB substrate, a direct aluminum bonding process (DAB) process to provide a DAB substrate, or an active metal brazing (AMB) process to provide an AMB substrate.

Joints 114 including a sintered silver layer and a diffusion soldered layer join metal layers 112 to semiconductor chips 116 as will be described in more detail below with reference to FIG. 2. Joints 106 including a sintered silver layer and a diffusion soldered layer join metal layers 108 to metal baseplate 104 as will be described in more detail below with reference to FIG. 3.

Semiconductor chips 116 are electrically coupled to metal layers 112 through bond wires 118. In one embodiment, semiconductor chips 116 are power semiconductor chips and may include IGBTs, MOSFETs, JFETs, bipolar transistors, thyristors, diodes, and/or other suitable power components. Bond wires 118 include Al, Cu, Al—Mg, Au, or another suitable material. In one embodiment, bond wires 118 are bonded to semiconductor chips 116 and metal layers 112 using ultrasonic wire bonding. Metal layers 112 are electrically coupled to circuit board 120 and power contacts 124. Circuit board 120 is electrically coupled to control contacts 122.

Housing 130 encloses joints 106 including the sintered silver layers and the diffusion soldered layers, metallized ceramic substrates 110 including metal layers 108 and 112, joints 114 including the sintered silver layers and the diffusion soldered layers, semiconductor chips 116, bond wires 118, circuit board 120, portions of control contacts 122, and portions of power contacts 124. Housing 130 includes technical plastics or another suitable material. Housing 130 is joined to metal baseplate 104. In one embodiment, a single metallized ceramic substrate 110 is used such that metal baseplate 104 is excluded and housing 130 is joined directly to the single metallized ceramic substrate 110.

Potting material 126 fills areas below circuit board 120 within housing 130 around joints 106 including the sintered silver layers and the diffusion soldered layers, metallized ceramic substrates 110 including metal layers 108 and 112, joints 114 including the sintered silver layers and the diffusion soldered layers, semiconductor chips 116, and bond wires 118. Potting material 128 fills the area above circuit board 120 within housing 130 around portions of control contacts 122 and portions of power contacts 124. Potting material 126 and 128 includes silicone gel or another suitable material. Potting material 126 and 128 prevents damage to power electronic module 100 by dielectrical breakdown. In other embodiments, a single layer of potting material is used to at least cover bond wires 118.

Figure 2:
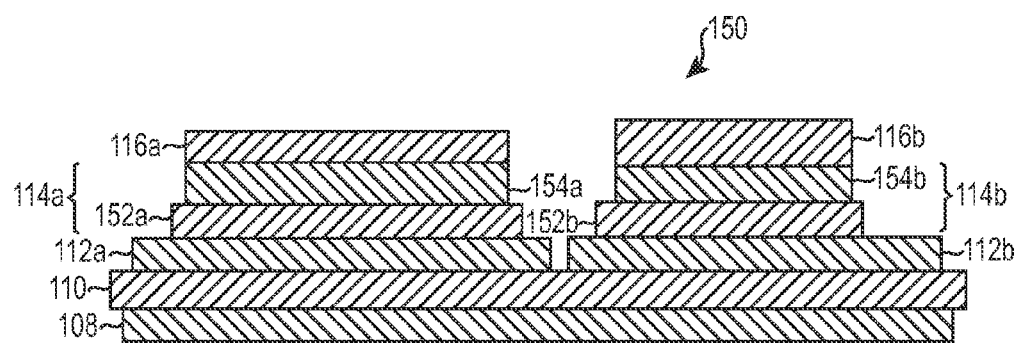
FIG. 2 illustrates a cross-sectional view of another embodiment of a semiconductor device.

FIG. 2 illustrates a cross-sectional view of another embodiment of a semiconductor device 150. Semiconductor device 150 includes a metalized ceramic substrate 110 including metal surfaces or layers 108 and 112a and 112b, joints 114a and 114b, and semiconductor chips 116a and 116b. Semiconductor chip 116a is coupled to metal layer 112a through joint 114a. Joint 114a includes a sintered silver layer 152a and a diffusion soldered layer 154a. Semiconductor chip 116b is coupled to metal layer 112b through joint 114b. Joint 114b includes a sintered silver layer 152b and a diffusion soldered layer 154b. In one embodiment, semiconductor chips 116a and 116b each include a silver surface layer facing and contacting diffusion soldered layers 154a and 154b, respectively.

Sintered silver layers 152a and 152b are formed on metal layers 112a and 112b, respectively. In one embodiment, sintered silver layers 152a and 152b each have a thickness between 10 μm and 50 μm in the direction substantially perpendicular to metalized ceramic substrate 110. In one embodiment, sintered silver layers 152a and 152b each have a thickness equal to or greater than the thickness of each diffusion soldered layer 154a and 154b, respectively. In another embodiment, sintered silver layers 152a and 152b each have a thickness at least 2.5 times the thickness of each diffusion soldered layer 154a and 154b, respectively. Sintered silver layers 152a and 152b include pores into which liquid solder may flow during the diffusion soldering process used to form diffusion soldered layers 154a and 154b. In one embodiment, sintered silver layers 152a and 152b have a porosity of up to 20 percent or up to 30 percent.

Diffusion soldered layers 154a and 154b couple semiconductor chips 116a and 116b to sintered silver layers 152a and 152b, respectively. In one embodiment, diffusion soldered layers 154a and 154b have a thickness between 5 μm and 20 μm in the direction substantially perpendicular to metalized ceramic substrate 110. Diffusion soldered layers 154a and 154b include Ag—Sn intermetallic phases. In one embodiment, during the diffusion soldering process, all the soft solder used to form diffusion soldered layers 154a and 154b is consumed to form a substantially pure intermetallic layer between each semiconductor chip 116a and 116b and each sintered silver layer 152a and 152b, respectively. In one embodiment, the surface area of the face of each sintered silver layer 152a and 152b facing each diffusion soldered layer 154a and 154b is greater than the surface area of the face of each diffusion soldered layer 154a and 154b facing each sintered silver layer 152a and 152b, respectively.

Figure 3:
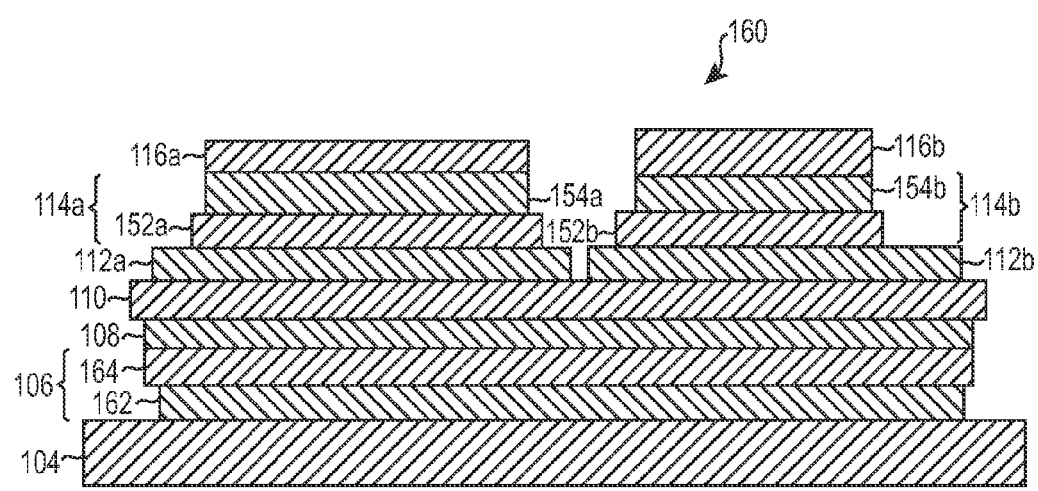
FIG. 3 illustrates a cross-sectional view of another embodiment of a semiconductor device.

FIG. 3 illustrates a cross-sectional view of another embodiment of a semiconductor device 160. Semiconductor device 160 is similar to semiconductor device 150 previously described and illustrated with reference to FIG. 2, except that semiconductor device 160 also includes a baseplate 104 and a joint 106. Baseplate 104 is coupled to metal layer 108 of metalized ceramic substrate 110 through joint 106. Joint 106 includes a sintered silver 164 and a diffusion soldered layer 162. In one embodiment, baseplate 104 includes a silver surface layer facing and contacting diffusion soldered layer 162.

Sintered silver layer 164 is formed on metal layer 108. In one embodiment, sintered silver layer 164 has a thickness between 10 μm and 50 μm in the direction substantially perpendicular to metalized ceramic substrate 110. In one embodiment, sintered silver layer 164 has a thickness equal to or greater than the thickness of diffusion soldered layer 162. In another embodiment, sintered silver layer 164 has a thickness at least 2.5 times the thickness of diffusion soldered layer 162. Sintered silver layer 164 includes pores into which liquid solder may flow during the diffusion soldering process used to form diffusion soldered layer 162. In one embodiment, sintered silver layer 164 has a porosity of up to 20 percent or up to 30 percent.

Diffusion soldered layer 162 couples baseplate 104 to sintered silver layer 164. In one embodiment, diffusion soldered layer 162 has a thickness between 5 μm and 20 μm in the direction substantially perpendicular to metalized ceramic substrate 110. Diffusion soldered layer 162 include Ag—Sn intermetallic phases. In one embodiment, during the diffusion soldering process, all the soft solder used to form diffusion soldered layer 162 is consumed to form a substantially pure intermetallic layer between baseplate 104 and sintered silver layer 164. In one embodiment, the surface area of the face of sintered silver layer 164 facing diffusion soldered layer 162 is greater than the surface area of the face of diffusion soldered layer 162 facing sintered silver layer 164.

In another embodiment, sintered silver layer 164 is formed on baseplate 104 and diffusion soldered layer 162 is formed between the sintered silver layer and metal layer 108 of metalized ceramic substrate 110. In one embodiment, sintered silver layer 164 and sintered silver layers 152a and 152b are formed substantially simultaneously. In other embodiments, sintered silver layer 164 is formed during a first sintering process, and sintered silver layers 152a and 152b are formed during a second sintering process either before or after the first sintering process.

In one embodiment, semiconductor chips 116a and 116b and baseplate 104 are diffusion soldered to sintered silver layers 152a, 152b, and 164, respectively, substantially simultaneously. In other embodiments, semiconductor chips 116a and 116b are diffusion soldered to sintered silver layers 152a and 152b in a first diffusion soldering process, and baseplate 104 is diffusion soldered to sintered silver layer 164 during a second diffusion soldering process either before or after the first diffusion soldering process.

Figure 4:
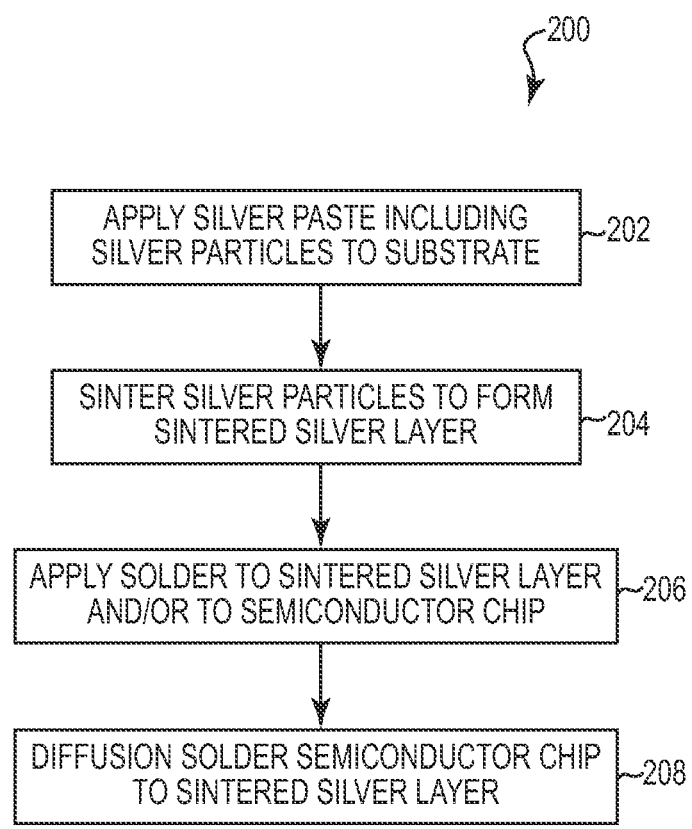
FIG. 4 is a flow diagram illustrating one embodiment of a method for fabricating a semiconductor device.

FIG. 4 is a flow diagram illustrating one embodiment of a method 200 for fabricating a semiconductor device, such as semiconductor device 150 previously described and illustrated with reference to FIG. 2 or semiconductor device 160 previously described and illustrated with reference to FIG. 3. At 202, a silver paste including silver particles is applied onto the substrate (e.g., metal layer 112a and/or 112b). The silver paste includes silver microparticles and/or nanoparticles coated with an organic material. The coated silver particles are dispersed in a solvent such that the silver paste may be applied to the substrate. The silver paste may be applied by printing, dispensing, or other suitable method. In one embodiment, after applying the silver paste, the silver paste is dried to remove the solvent.

At 204, the silver particles are sintered in a press or other suitable sintering tool to form a sintered silver layer (e.g., sintered silver layer 152a and/or 152b). In one embodiment, the silver particles are sintered at a temperature between 150° C. and 300° C. at a pressure between 1 MPa and 50 MPa for a period between 10 seconds and 600 seconds. In another embodiment, the silver particles are sintered at a temperature between 220° C. and 250° C. at a pressure around 30 MPa for a period between 60 seconds and 90 seconds. During the sintering process, the organic coating on the silver particles decomposes and the silver particles adhere to each other. In one embodiment, the resulting sintered silver layer has a porosity of up to 20 percent or up to 30 percent and a thickness between 3 μm and 100 μm.

At 206, solder is applied onto the sintered silver layer (e.g., sintered silver layer 152a and/or 152b) and/or onto the semiconductor chip (e.g., semiconductor chip 116a and/or 116b). In one embodiment, the solder is Sn solder or Ag—Sn solder having a concentration of Ag between zero percent and four percent. The semiconductor chip is then placed onto the sintered silver layer such that the solder is between the semiconductor chip and the sintered silver layer.

At 208, the semiconductor chip is diffusion soldered to the sintered silver layer. In one embodiment, the semiconductor chip is diffusion soldered to the sintered silver layer at a temperature between 200° C. and 420° C. at a pressure between 0.1 MPa and 7 MPa for a period between 0.2 seconds and 120 seconds. During the diffusion soldering process, the solder melts and Ag from the sintered silver layer diffuses into the liquid solder and reacts with the solder to generate Ag—Sn intermetallic phases. By having a sufficiently thick sintered silver layer, substantially only silver is diffused into the liquid solder such that a substantially pure Ag—Sn intermetallic layer is formed. By diffusion soldering on the porous sintered silver layer, the reaction speed is increased such that the length of the diffusion soldering process is shortened.

Figure 5:
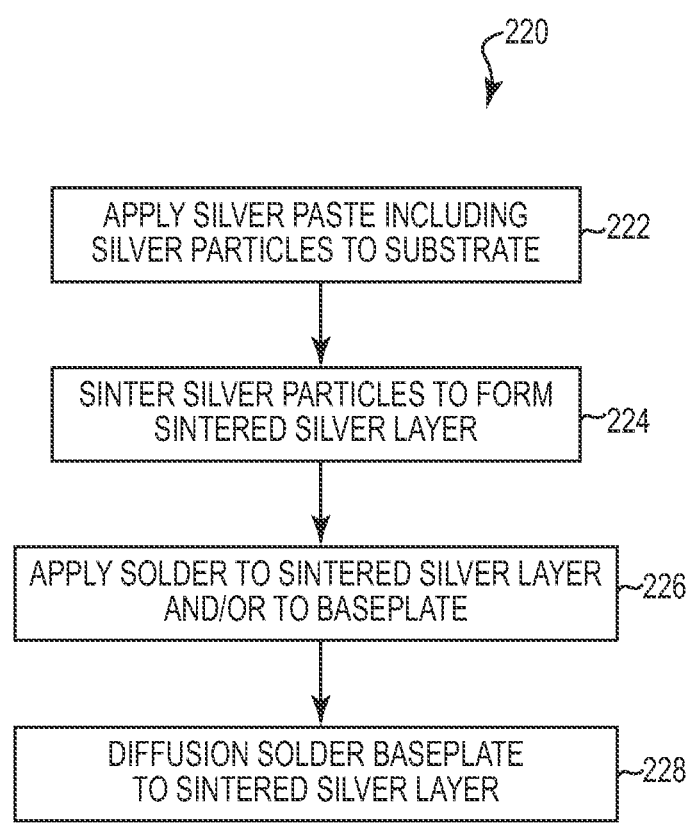
FIG. 5 is a flow diagram illustrating another embodiment of a method for fabricating a semiconductor device.

FIG. 5 is a flow diagram illustrating another embodiment of a method 220 for fabricating a semiconductor device, such as semiconductor device 160 previously described and illustrated with reference to FIG. 3. At 222, a silver paste including silver particles is applied onto the substrate (e.g., metal layer 108). The silver paste includes silver microparticles and/or nanoparticles coated with an organic material. The coated silver particles are dispersed in a solvent such that the silver paste may be applied to the substrate. The silver paste may be applied by printing, dispensing, or other suitable method. In one embodiment, after applying the silver paste, the silver paste is dried to remove the solvent. In another embodiment, the silver paste is applied onto the baseplate (e.g., baseplate 104) instead of on the substrate.

At 224, the silver particles are sintered in a press or other suitable sintering tool to form a sintered silver layer (e.g., sintered silver layer 164). In one embodiment, the silver particles are sintered at a temperature between 150° C. and 300° C. at a pressure between 1 MPa and 50 MPa for a period between 10 seconds and 600 seconds. In another embodiment, the silver particles are sintered at a temperature between 220° C. and 250° C. at a pressure around 30 MPa for a period between 60 seconds and 90 seconds. During the sintering process, the organic coating of the silver particles decomposes and the silver particles adhere to each other. In one embodiment, the resulting sintered silver layer has a porosity of up to 20 percent or up to 30 percent and a thickness between 3 μm and 100 μm.

At 226, solder is applied onto the sintered silver layer (e.g., sintered silver layer 164) and/or onto the baseplate (e.g., baseplate 104). In one embodiment, the solder is Sn solder or Ag—Sn solder having a concentration of Ag between zero percent and four percent. The baseplate is then placed onto the sintered silver layer such that the solder is between the baseplate and the sintered silver layer. In another embodiment, where the sintered silver layer is formed on the baseplate, the solder is applied onto the sintered silver layer and/or the substrate (e.g., metal layer 108) such that the solder is between the substrate and the sintered silver layer.

At 228, the baseplate is diffusion soldered to the sintered silver layer. In one embodiment, the baseplate is diffusion soldered to the sintered silver layer at a temperature between 200° C. and 420° C. at a pressure between 0.1 MPa and 7 MPa for a period between 0.2 seconds and 120 seconds. During the diffusion soldering process, the solder melts and Ag from the sintered silver layer diffuses into the liquid solder and reacts with the solder to generate Ag—Sn intermetallic phases. By having a sufficiently thick sintered silver layer, substantially only silver is diffused into the liquid solder such that a substantially pure Ag—Sn intermetallic layer is formed. By diffusion soldering on the porous sintered silver layer, the reaction speed is increased such that the length of the diffusion soldering process is shortened. In another embodiment, the substrate is diffusion soldered to the sintered silver layer formed on the baseplate.

Embodiments provide a semiconductor device having a joint including a diffusion soldered layer and a sintered silver layer. The sintered silver layer and the diffusion soldered layer provide a joint between a semiconductor chip and a substrate or between a substrate and a baseplate. The sintered silver layer enables a pure Ag—Sn intermetallic layer to be formed that has a higher melting point than Cu—Sn intermetallic phases. Thus, a more reliable semiconductor device having an increased lifetime is fabricated.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof

What is claimed is:

1. A semiconductor device comprising:
   a substrate;
   a first sintered silver layer on the substrate, the first sintered silver layer comprising pores;
   a first semiconductor chip; and
   a first diffusion soldered layer coupling the first semiconductor chip to the first sintered silver layer, the first diffusion soldered layer comprising Ag—Sn.

2. The semiconductor device of claim 1, wherein the first diffusion soldered layer comprises Ag—Sn intermetallic phases.

3. The semiconductor device of claim 1, wherein the first sintered silver layer comprises a porosity of up to 30 percent.

4. The semiconductor device of claim 1, further comprising:
   a second sintered silver layer on the substrate;
   a second semiconductor chip; and
   a second diffusion soldered layer coupling the second semiconductor chip to the second sintered silver layer.

5. The semiconductor device of claim 1, further comprising:
   a baseplate;
   a second sintered silver layer; and
   a second diffusion soldered layer on the second sintered silver layer,
   wherein the second sintered silver layer and the second diffusion soldered layer form a joint joining the baseplate to the substrate.

6. The semiconductor device of claim 1, wherein the substrate comprises a metalized ceramic substrate.

7. The semiconductor device of claim 1, wherein the first semiconductor chip comprises a power semiconductor chip.

8. The semiconductor device of claim 1, wherein a thickness of the first sintered silver layer is equal to or greater than a thickness of the first diffusion soldered layer.

9. A semiconductor device comprising:
   a metalized ceramic substrate;
   a sintered silver layer on the metalized ceramic substrate, the sintered silver layer compromising pores;
   a semiconductor chip; and
   a diffusion soldered layer coupling the semiconductor chip to the sintered silver layer, the diffusion soldered layer comprising Ag—Sn intermetallic phases.

10. The semiconductor device of claim 9, wherein a thickness of the sintered silver layer is equal to or greater than a thickness of the diffusion soldered layer.

11. The semiconductor device of claim 9, wherein the diffusion soldered layer consists of a substantially pure Ag—Sn intermetallic layer.

12. The semiconductor device of claim 9, wherein the sintered silver layer comprises a porosity of up to 30 percent.

13. The semiconductor device of claim 9, wherein the metalized ceramic substrate comprises a ceramic layer, a first copper layer on a first side of the ceramic layer, and a second copper layer on a second side of the ceramic layer opposite the first side of the ceramic layer.

14. The semiconductor device of claim 9, wherein a surface area of a face of the sintered silver layer facing the diffusion soldered layer is greater than a surface area of a face of the diffusion soldered layer facing the sintered silver layer.

15. The semiconductor device of claim 9, wherein the semiconductor device comprises a silver surface layer facing the diffusion soldered layer.

16. A semiconductor device comprising:
   a substrate;
   a first sintered silver layer on the substrate;
   a first semiconductor chip;
   a first diffusion soldered layer coupling the first semiconductor chip to the first sintered silver layer;
   a baseplate;
   a second sintered silver layer; and
   a second diffusion soldered layer on the second sintered silver layer,
   wherein the second sintered silver layer and the second diffusion soldered layer form a joint joining the baseplate to the substrate.

17. The semiconductor device of claim 16, wherein the first diffusion soldered layer comprises Ag—Sn intermetallic phases.

18. The semiconductor device of claim 16, wherein the first sintered silver layer comprises pores.

19. The semiconductor device of claim 16, further comprising:
   a third sintered silver layer on the substrate;
   a second semiconductor chip; and
   a third diffusion soldered layer coupling the second semiconductor chip to the third sintered silver layer.

20. The semiconductor device of claim 16, wherein the substrate comprises a metalized ceramic substrate.

21. The semiconductor device of claim 16, wherein the first semiconductor chip comprises a power semiconductor chip.

22. The semiconductor device of claim 16, wherein a thickness of the first sintered silver layer is equal to or greater than a thickness of the first diffusion soldered layer.

* * * * *